(12) United States Patent
Hosoda et al.

(10) Patent No.: US 10,716,203 B2
(45) Date of Patent: Jul. 14, 2020

(54) ADHESIVE FILM AND FLEXIBLE METAL LAMINATE

(71) Applicant: AGC Inc., Chiyoda-ku (JP)

(72) Inventors: Tomoya Hosoda, Chiyoda-ku (JP); Eiichi Nishi, Chiyoda-ku (JP); Toru Sasaki, Chiyoda-ku (JP); Yasuhiko Matsuoka, Chiyoda-ku (JP); Wataru Kasai, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 50 days.

(21) Appl. No.: 15/140,912

(22) Filed: Apr. 28, 2016

(65) Prior Publication Data

US 2016/0242274 A1      Aug. 18, 2016

Related U.S. Application Data

(63) Continuation of application No. PCT/JP2014/081602, filed on Nov. 28, 2014.

(30) Foreign Application Priority Data

Nov. 29, 2013   (JP) .................................. 2013-247615

(51) Int. Cl.
*H05K 1/02* (2006.01)
*B32B 15/08* (2006.01)
(Continued)

(52) U.S. Cl.
CPC ............... *H05K 1/028* (2013.01); *B32B 7/12* (2013.01); *B32B 15/08* (2013.01); *B32B 27/281* (2013.01);
(Continued)

(58) Field of Classification Search
CPC ..... B32B 27/08; B32B 15/08; B32B 2270/00; C08L 63/00; C08L 27/18; C08F 214/18; H05K 1/02; C09J 7/30; C09J 127/18
See application file for complete search history.

(56) References Cited

U.S. PATENT DOCUMENTS 7,078,470 B2 *  7/2006  Funaki .................... B32B 27/08
                                                                526/242
7,112,640 B2 *  9/2006  Funaki .................... B32B 27/08
                                                                430/270.1
(Continued)

FOREIGN PATENT DOCUMENTS

JP       2005-23261      1/2005
JP       2007-314720     12/2007
(Continued)

OTHER PUBLICATIONS

International Search Report dated Mar. 3, 2015 in PCT/JP2014/081602 filed on Nov. 28, 2014.

*Primary Examiner* — Dean O Takaoka
*Assistant Examiner* — Alan Wong
(74) *Attorney, Agent, or Firm* — Oblon, McClelland, Maier & Neustadt, L.L.P.

(57) ABSTRACT

To provide an adhesive film comprising a polyimide film and a fluorinated resin layer directly laminated, in which blisters (foaming) in an atmosphere corresponding to reflow soldering at high temperature are suppressed, and a flexible metal laminate.
An adhesive film having a fluorinated resin layer containing a fluorinated copolymer (A) directly laminated on one side or both sides of a polyimide film, wherein the fluorinated copolymer (A) has a melting point of at least 280° C. and at most 320° C., is melt-moldable, and has at least one type of functional groups selected from the group consisting of a carbonyl group-containing group, a hydroxy group, an
(Continued)

epoxy group and an isocyanate group, and the fluorinated resin layer has a thickness of from 1 to 20 μm.

16 Claims, 1 Drawing Sheet

(51) Int. Cl.
| | |
|---|---|
| C09J 7/30 | (2018.01) |
| C09J 127/18 | (2006.01) |
| B32B 7/12 | (2006.01) |
| C09J 7/22 | (2018.01) |
| H01P 11/00 | (2006.01) |
| H05K 3/38 | (2006.01) |
| B32B 27/28 | (2006.01) |
| C09J 179/08 | (2006.01) |
| H01P 3/08 | (2006.01) |
| H05K 1/03 | (2006.01) |
| H05K 3/06 | (2006.01) |
| H05K 3/22 | (2006.01) |
| H05K 3/46 | (2006.01) |

(52) U.S. Cl.
CPC . *C09J 7/22* (2018.01); *C09J 7/30* (2018.01); *C09J 127/18* (2013.01); *C09J 179/08* (2013.01); *H01P 3/081* (2013.01); *H01P 11/003* (2013.01); *H05K 1/0237* (2013.01); *H05K 1/0373* (2013.01); *H05K 3/06* (2013.01); *H05K 3/22* (2013.01); *H05K 3/386* (2013.01); *H05K 3/4652* (2013.01); *B32B 2307/308* (2013.01); *B32B 2457/08* (2013.01); *C09J 2201/122* (2013.01); *C09J 2201/128* (2013.01); *C09J 2203/326* (2013.01); *C09J 2427/00* (2013.01); *C09J 2479/086* (2013.01); *H05K 1/0393* (2013.01); *H05K 2201/0104* (2013.01)

(56) References Cited

U.S. PATENT DOCUMENTS

| | | | |
|---|---|---|---|
| 7,476,434 B2* | 1/2009 | Iwasa | B32B 15/08 |
| | | | 428/141 |
| 7,662,454 B2* | 2/2010 | Funaki | B32B 1/08 |
| | | | 428/35.7 |
| 7,687,142 B2* | 3/2010 | Iwasa | B32B 15/08 |
| | | | 174/264 |
| 2008/0107866 A1 | 5/2008 | Iwasa et al. | |
| 2016/0078979 A1* | 3/2016 | Hosoda | C08F 214/26 |
| | | | 156/52 |

FOREIGN PATENT DOCUMENTS

| | | |
|---|---|---|
| JP | 2013-67810 | 4/2013 |
| WO | WO 2006/067970 A1 | 6/2006 |

* cited by examiner

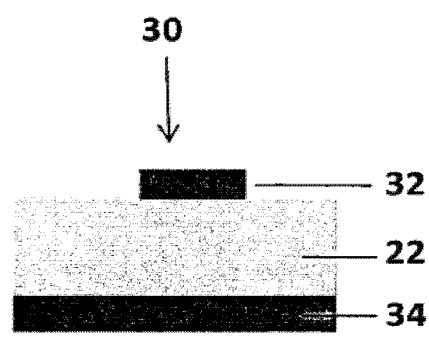

ADHESIVE FILM AND FLEXIBLE METAL LAMINATE

TECHNICAL FIELD

The present invention relates to an adhesive film and a flexible metal laminate.

BACKGROUND ART

In recent years, along with weight saving, downsizing and high densification of electronics products, demands for printed circuit boards are increasing. Particularly, demands for flexible metal laminates (also called flexible printed circuits (FPC) or the like) are increasing. A flexible metal laminate has a structure having a circuit consisting of a metal foil formed on an insulating film.

A flexible metal laminate is commonly produced by heating and contact-bonding a metal foil to the surface of a substrate by means of an adhesive material, employing as the substrate a flexible insulating film formed of an insulating material. As the insulating film, e.g. a polyimide film is preferably used. As the adhesive material, a thermosetting adhesive such as an epoxy or acrylic adhesive is commonly used.

A thermosetting adhesive is advantageous in that adhesion at a relatively low temperature is possible. However, in future, FPCs using a thermosetting adhesive are considered to be insufficient as required properties such as heat resistance, bending property and electrical reliability become strict.

As a FPC using no thermosetting adhesive, a FPC having a metal foil directly bonded to an insulating film and a FPC using a thermoplastic polyimide for the adhesive layer have been proposed (Patent Document 1).

Further, a laminate for a flexible printed wiring having a reinforcing layer of e.g. a polyimide resin and an electrical conductor layer such as a copper foil laminated via an electrical insulator layer made of a fluorinated copolymer having acid anhydride groups has been proposed (Patent Document 2). The fluorinated copolymer has adhesion, and the electrical insulator layer functions as an adhesive layer. Further, the fluorinated copolymer is a fluorinated resin excellent in electrical properties and by using it as a layer in contact with the electrical conductor layer (metal foil), excellent electrical reliability as compared with a case of using a thermoplastic polyimide will be obtained.

PRIOR ART DOCUMENTS

Patent Documents

Patent Document 1: JP-A-2013-67810
Patent Document 2: WO2006/067970

DISCLOSURE OF INVENTION

Technical Problem

To mount components such as electronic components and wiring components on the surface of a printed circuit board, reflow soldering is carried out. Reflow soldering is a process in which a solder paste is printed on a printed circuit board, components are placed thereon and then the assembly is heated to melt the solder.

According to studies by the present inventors, if a laminate having a fluorinated resin layer containing a fluorinated copolymer directly laminated on one side or both sides of a polyimide film as disclosed in Patent Document 2 is exposed to an atmosphere corresponding to reflow soldering at high temperature, blisters (foaming) due to heat may form in the fluorinated resin layer. Particularly in a procedure in which a solder iron is pressed at high temperature for the purpose of mounting on the metal layer having wirings formed thereon on the fluorinated resin layer of the laminate, when a solder iron is pressed on the wirings, problems such as blisters in the fluorinated resin layer and that the wirings are removed from the fluorinated resin layer may arise.

Under these circumstances, the object of the present invention is to provide an adhesive film having a polyimide film and a fluorinated resin layer directly laminated, in which blisters (foaming) in an atmosphere corresponding to reflow soldering at high temperature are suppressed and which withstands a solder iron at high temperature, and a flexible metal laminate.

Solution to Problem

The present invention provides the following.
[1] An adhesive film having a fluorinated resin layer containing a fluorinated copolymer (A) directly laminated on one side or both sides of a polyimide film, wherein
 the fluorinated copolymer (A) has a melting point of at least 280° C. and at most 320° C., is melt-moldable, and has at least one type of functional groups selected from the group consisting of a carbonyl group-containing group, a hydroxy group, an epoxy group and an isocyanate group, and
 the fluorinated resin layer has a thickness of from 1 to 20 μm.
[2] The adhesive film according to the above [1], wherein the fluorinated copolymer (A) has at least carbonyl group-containing groups as the functional groups, and the carbonyl group-containing group is at least one member selected from the group consisting of a hydrocarbon group having a carbonyl group between carbon atoms, a carbonate group, a carboxy group, a haloformyl group, an alkoxycarbonyl group and an acid anhydride residue.
[3] The adhesive film according to the above [1] or [2], wherein the fluorinated copolymer (A) comprises structural units (a1) derived from tetrafluoroethylene, structural units (a2) derived from a cyclic hydrocarbon monomer having an acid anhydride residue and a polymerizable unsaturated bond and structural units (a3) derived from a fluorinated monomer (excluding tetrafluoroethylene).
[4] The adhesive film according to any one of the above [1] to [3], wherein the content of the functional groups is from 10 to 60,000 groups per $1 \times 10^6$ carbon atoms in the main chain of the fluorinated copolymer (A).
[5] The adhesive film according to any one of the above [1] to [4], wherein the fluorinated resin layer has a thickness of from 3 to 15 μm.
[6] The adhesive film according to any one of the above [1] to [5], wherein the polyimide film has a thickness of from 3 to 50 μm.
[7] The adhesive film according to any one of the above [1] to [6], wherein the melt flow rate of the fluorinated copolymer (A) at 372° C. under a load of 49 N is from 0.5 to 15 g/10 min, and the melt flow rate of the fluorinated copolymer (A) subjected to heat treatment at 370° C. or higher is lower than the melt flow rate of the fluorinated copolymer (A) before the heat treatment.
[8] The adhesive film according to any one of the above [1] to [7], which has an entire thickness of at most 150 μm.

[9] A flexible metal laminate comprising the adhesive film as defined in any one of the above [1] to [8], and a metal film directly laminated on the fluorinated resin layer of the adhesive film.

[10] A method for producing an adhesive film, which comprises subjecting the adhesive film as defined in any one of the above [1] to [8] to heat treatment at 370° C. or higher.

[11] A method for producing a flexible metal laminate, which comprises subjecting the flexible metal laminate as defined in the above [9] to heat treatment at 370° C. or higher.

[12] A flexible printed circuit board, having a pattern circuit formed by etching the metal foil of the flexible metal laminate as defined in the above [9].

[13] A flexible printed circuit board, having a microstrip line including a microstrip transmission line formed by etching the metal foil of the flexible metal laminate as defined in the above [9], wherein
in the microstrip line, the transmission loss [a] after the following conditioning [a] and the transmission loss [b] after the following conditioning [b], measured at a temperature of from 20 to 25° C. under a humidity of from 40 to 60% RH after the conditioning [a] or [b], satisfy ([b]−[a])<0.004 dB/mm:
[a]: firing at a temperature of 105° C. for 48 hours;
[b]: firing at a temperature of 105° C. for 24 hours and storing at a temperature of 60° C. under a humidity of 90% RH for 24 hours.

[14] A method for producing the flexible printed circuit board as defined in the above [12] or [13], which comprises a soldering step on a pattern circuit by means of a soldering iron.

Advantageous Effects of Invention

According to the present invention, it is possible to provide an adhesive film having a polyimide film and a fluorinated resin layer directly laminated, in which blisters (foaming) in an atmosphere corresponding to reflow soldering at high temperature are suppressed, and a flexible metal laminate.

BRIEF DESCRIPTION OF DRAWING

FIG. 1 is a cross-sectional view schematically illustrating a microstrip line used to measure the transmission loss.

DESCRIPTION OF EMBODIMENTS

[Adhesive Film]

The adhesive film of the present invention has a fluorinated resin layer containing a fluorinated copolymer (A) directly laminated on one side or both sides of a polyimide film, wherein
the fluorinated copolymer (A) has a melting point of at least 280° C. and at most 320° C., is melt-moldable, and has at least one type of functional groups selected from the group consisting of a carbonyl group-containing group, a hydroxy group, an epoxy group and an isocyanate group, and
the fluorinated resin layer has a thickness of from 1 to 20 µm.

(Fluorinated Resin Layer)

The fluorinated resin layer contains the fluorinated copolymer (A).

The melting point of the fluorinated copolymer (A) is at least 280° C. and at most 320° C., preferably at least 295° C. and at most 315° C., particularly preferably at least 295° C. and at most 310° C.

When the melting point of the fluorinated copolymer (A) is at least the lower limit value of the above range, the fluorinated copolymer (A) is excellent in the heat resistance, and when it is at most the upper limit value of the above range, the fluorinated copolymer (A) is excellent in the moldability.

The melting point of the fluorinated copolymer (A) may be adjusted e.g. by the type and the content of structural units constituting the fluorinated copolymer (A), the molecular weight, etc. For example, the higher the proportion of the after-mentioned structural units (a1)) is, the higher the melting point tends to be.

The fluorinated copolymer (A) is melt-moldable. "Melt-moldable" means that the copolymer has melt flowability.

The melt flow rate (hereinafter referred to as "MFR") of the fluorinated copolymer (A) at a temperature higher by at least 20° C. than the melting point of the fluorinated copolymer (A) (usually 372° C.) under a load of 49N is preferably from 0.1 to 1,000 g/10 min, more preferably from 0.5 to 100 g/10 min, further preferably from 1 to 30 g/10 min, most preferably from 5 to 20 g/10 min.

When MFR is at least the lower limit value of the above range, the fluorinated copolymer (A) is excellent in moldability, and a fluorinated resin layer formed from such a fluorinated copolymer (A) is excellent in the surface smoothness and the outer appearance. When MFR is at most the upper limit value of the above range, a fluorinated resin layer containing such a fluorinated copolymer (A) is excellent in mechanical strength.

When the melt flow rate of the fluorinated copolymer (A) at 372° C. under a load of 49N is from 0.5 to 15 g/10 min, the solder iron heat resistance tends to improve.

MFR is an index of the molecular weight of the fluorinated copolymer (A), and a high MFR indicates a low molecular weight and a low MFR indicates a high molecular weight. The molecular weight and thus MFR of the fluorinated copolymer (A) may be adjusted by conditions for production of the fluorinated copolymer (A). For example, when the polymerization time is shortened at the time of polymerizing monomers, MFR tends to be high.

To decrease MFR, a method of subjecting the fluorinated copolymer (A) to heat treatment to form a crosslinked structure thereby to increase the molecular weight; a method of reducing the amount of a radical polymerization initiator used when the fluorinated copolymer (A) is produced; or the like may be mentioned.

Further, the melt flow rate of the fluorinated copolymer (A) in the adhesive film subjected to heat treatment at 370° C. or higher, at 372° C. under a load of 49N, is preferably from 0.1 to 15 g/10 min, more preferably from 1 to 15 g/10 min.

Further, the melt flow rate of the fluorinated copolymer (A) in a flexible metal laminate subjected to heat treatment at 370° C. or higher, at 372° C. under a load of 49N, is preferably from 0 to 16 g/10 min, more preferably from 0 to 15 g/10 min.

The fluorinated copolymer (A) has at least one type of functional groups (hereinafter referred to as functional groups (I)) selected from the group consisting of a carbonyl group-containing group, a hydroxy group, an epoxy group and an isocyanate group. By the fluorinated copolymer (A) having functional groups (I), the fluorinated resin layer containing the fluorinated copolymer (A) will be well contact-bonded to the polyimide film and the metal foil.

The functional groups (I) are preferably located on at least one of the main chain terminal and the side chains of the fluorinated copolymer (A).

The fluorinated copolymer (A) may have one type or more types of the functional groups (I).

The fluorinated copolymer (A) preferably has at least carbonyl group-containing groups as the functional groups (I).

The carbonyl group-containing group is a group containing a carbonyl group (—C(═O)—) in its structure, and may, for example, be a hydrocarbon group having a carbonyl group between carbon atoms, a carbonate group, a carboxy group, a haloformyl group, an alkoxycarbonyl group or an acid anhydride residue.

The hydrocarbon group may, for example, be a $C_{2-8}$ alkylene group. The number of carbon atoms of the alkylene group is the number of carbon atoms not including the carbonyl group. The alkylene group may be linear or branched.

The haloformyl group is represented by —C(═O)—X (wherein X is a halogen atom). The halogen atom in the haloformyl group may, for example, be a fluorine atom or a chlorine atom and is preferably a fluorine atom. That is, the haloformyl group is preferably a fluoroformyl group (also called a carbonyl fluoride group).

The alkoxy group in the alkoxycarbonyl group may be linear or branched, and is preferably a $C_{1-8}$ alkoxy group, particularly preferably a methoxy group or an ethoxy group.

The content of the functional groups (I) in the fluorinated copolymer (A) is preferably from 10 to 60,000 groups, more preferably from 100 to 50,000 groups, further preferably from 100 to 10,000 groups, particularly preferably from 300 to 5,000 groups per $1 \times 10^6$ carbon atoms in the main chain of the fluorinated copolymer (A).

When the content of the functional groups (I) is at least the lower limit value of the above range, more excellent adhesion between the fluorinated resin layer containing the fluorinated copolymer (A) and the polyimide film will be achieved, and when it is at most the upper limit value of the above range, a high level of adhesion to the polyimide film will be obtained at low processing temperature.

The content of the functional groups (I) may be measured e.g. by nuclear magnetic resonance (NMR) analysis, infrared absorption spectrum analysis, etc. For example, as disclosed in JP-A-2007-314720, the proportion (mol %) of structural units having the functional group (I) in all the structural units constituting the fluorinated copolymer (A) is obtained e.g. by infrared absorption spectrum analysis, and the content of the functional groups (I) can be calculated from the proportion.

The fluorinated copolymer (A) is preferably a copolymer comprising structural units (a1)) derived from tetrafluoroethylene (hereinafter sometimes referred to as "TFE"), structural units (a2) derived from a cyclic hydrocarbon monomer having an acid anhydride residue and a polymerizable unsaturated bond and structural units (a3) derived from a fluorinated monomer (excluding TFE).

Here, the acid anhydride residue of the structural units (a2) corresponds to the functional group (I).

The fluorinated copolymer (A) may have the functional group (I) as the main chain terminal group. The functional group (I) as the main chain terminal group is preferably an alkoxycarbonyl group, a carbonate group, a hydroxy group, a carboxy group, a fluoroformyl group or an acid anhydride residue. Such a functional group may be introduced by properly selecting a radical polymerization initiator, a chain transfer agent, etc. used at the time of production of the fluorinated copolymer (A).

The cyclic hydrocarbon monomer having an acid anhydride residue and a polymerizable unsaturated bond forming the structural units (a2) may, for example, be itaconic anhydride (hereinafter sometimes referred to as "IAH"), citraconic anhydride (hereinafter sometimes referred to as "CAH"), 5-norbornene-2,3-dicarboxylic acid anhydride (hereinafter sometimes referred to as "NAH") or maleic anhydride. They may be used alone or in combination of two or more.

Among them, preferred is at least one member selected from the group consisting of IAH, CAH and NAH. When at least one member selected from the group consisting of IAH, CAH and NAH is used, a fluorinated copolymer (A) containing acid anhydride residues may be easily produced without special polymerization method (JP-A-11-193312) which is necessary when maleic anhydride is used.

Among IAH, CAH and NAH, preferred is NAH in view of more excellent adhesion to the polyimide film.

The fluorinated monomer forming the structural units (a3) is preferably a fluorinated compound having one polymerizable double bond, and it may, for example, be a fluoroolefin (excluding TFE) such as vinyl fluoride, vinylidene fluoride (hereinafter sometimes referred to as "VdF"), trifluoroethylene, chlorotrifluoroethylene (hereinafter sometimes referred to as "CTFE") or hexafluoropropylene (hereinafter sometimes referred to as "HFP"), $CF_2$=$CFOR^{f1}$ (wherein $R^{f1}$ is a $C_{1-10}$ perfluoroalkyl group which may have an oxygen atom between carbon atoms), $CF_2$=$CFOR^{f2}SO_2X^1$ (wherein $R^{f2}$ is a $C_{1-10}$ perfluoroalkylene group which may have an oxygen atom between carbon atoms, and $X^1$ is a halogen atom or a hydroxy group), $CF_2$=$CFOR^{f3}CO_2X^2$ (wherein $R^{f3}$ is a $C_{1-10}$ perfluoroalkylene group which may have an oxygen atom between carbon atoms, and $X^2$ is a hydrogen atom or a $C_{1-3}$ alkyl group), $CF_2$=$CF(CF_2)_pOCF$=$CF_2$ (wherein p is 1 or 2), $CH_2$=$CX^3(CF_2)_qX^4$ (wherein $X^3$ is a hydrogen atom or a fluorine atom, q is an integer of from 2 to 10, and $X^4$ is a hydrogen atom or a fluorine atom) or perfluoro(2-methylene-4-methyl-1,3-dioxolane).

Among such fluorinated monomers, preferred is at least one member selected from the group consisting of VdF, CTFE, HFP, $CF_2$=$CFOR^{f1}$ and $CH_2$=$CX^3(CF_2)_qX^4$, more preferred is $CF_2$=$CFOR^{f1}$ or HFP.

$CF_2$=$CFOR^{f1}$ may, for example, be $CF_2$=$CFOCF_2CF_3$, $CF_2$=$CFOCF_2CF_2CF_3$, $CF_2$=$CFOCF_2CF_2CF_2CF_3$ or $CF_2$=$CFO(CF_2)_8F$, and is preferably $CF_2$=$CFOCF_2CF_2CF_3$ (hereinafter sometimes referred to as "PPVE").

$CH_2$=$CX^3(CF_2)_qX^4$ may, for example, be $CH_2$=$CH(CF_2)_2F$, $CH_2$=$CH(CF_2)_3F$, $CH_2$=$CH(CF_2)_4F$, $CH_2$=$CF(CF_2)_3H$ or $CH_2$=$CF(CF_2)_4H$, and is preferably $CH_2$=$CH(CF_2)_4F$ or $CH_2$=$CH(CF_2)_2F$.

The fluorinated copolymer (A) preferably comprises from 50 to 99.89 mol % of the structural units (a1), from 0.01 to 5 mol % of the structural units (a2) and from 0.1 to 49.99 mol % of the structural units (a3), more preferably from 50 to 99.4 mol % of the structural units (a1), from 0.1 to 3 mol % of the structural units (a2) and from 0.5 to 49.9 mol % of the structural units (a3), particularly preferably from 50 to 98.9 mol % of the structural units (a1), from 0.1 to 2 mol % of the structural units (a2) and from 1 to 49.9 mol % of the structural units (a3), based on the total molar amount of the structural units (a1), (a2) and (a3).

When the contents of the respective structural units are within the above ranges, the fluorinated copolymer (A) will be excellent in heat resistance and chemical resistance, and the fluorinated resin layer containing it will be excellent in elastic modulus at high temperature.

Particularly when the content of the structural units (a2) is within the above range, the amount of the acid anhydride residues in the fluorinated copolymer (A) will be appropriate, and the fluorinated resin layer will be excellent in the adhesion to the polyimide film and the adhesion to the metal foil to be laminated on the adhesive film.

When the content of the structural units (a3) is within the above range, the fluorinated copolymer (A) will be excellent in moldability, and the fluorinated resin layer containing it will be more excellent in mechanical properties such as flex resistance.

The contents of the respective structural units may be calculated by melt NMR analysis, fluorine content analysis, infrared absorption spectrum analysis or the like of the fluorinated copolymer (A).

In a case where the fluorinated copolymer (A) consists of the structural units (a1), (a2) and (a3), the content of the structural units (a2) being 0.01 mol % based on the total molar amount of the structural units (a1), (a2) and (a3) corresponds to a content of acid anhydride residues in the fluorinated copolymer (A) of 100 residues are $1\times10^6$ carbon atoms in the main chain of the fluorinated copolymer (A). The content of the structural units (a2) being 5 mol % based on the total molar amount of the structural units (a1), (a2) and (a3) corresponds to a content of acid anhydride residues in the fluorinated copolymer (A) of 50,000 residues per $1\times10^6$ carbon atoms in the main chain of the fluorinated copolymer (A).

The fluorinated copolymer (A) comprising the structural units (a2) may contain structural units derived from a dicarboxylic acid (such as itaconic acid, citraconic acid, 5-norbornene-2,3-dicarboxylic acid or maleic acid) corresponding to the acid anhydride residue as a result of partial hydrolysis of the cyclic hydrocarbon monomer having an acid anhydride residue and a polymerizable unsaturated bond, in some cases. In a case where structural units derived from such a dicarboxylic acid are contained, the content of such structural units is included in the content of the structural units (a2). The fluorinated copolymer (A) may have, in addition to the above structural units (a1) to (a3), structural units (a4) derived from a non-fluorinated monomer (excluding the cyclic hydrocarbon monomer having an acid anhydride residue and a polymerizable unsaturated bond).

The non-fluorinated monomer is preferably a non-fluorinated compound having one polymerizable double bond, such as an olefin having at most 3 carbon atoms such as ethylene or propylene or a vinyl ester such as vinyl acetate. Such monomers may be used alone or in combination of two or more.

Among them, preferred is ethylene, propylene or vinyl acetate, and particularly preferred is ethylene.

In a case where the fluorinated copolymer (A) has structural units (a4), the content of the structural units (a4) is preferably from 5 to 90 mol %, more preferably from 5 to 80 mol %, most preferably from 10 to 65 mol % per 100 mol % of the total molar amount of the structural units (a1), (a2) and (a3).

The total molar amount of the structural units (a1) to (a3) is preferably at least 60 mol %, more preferably at least 65 mol %, most preferably at least 68 mol % per 100 mol % of the total molar amount of all the structural units in the fluorinated copolymer (A). The upper limit is preferably 100 mol %.

Preferred specific examples of the fluorinated copolymer (A) include a TFE/PPVE/NAH copolymer, a TFE/PPVE/IAH copolymer, a TFE/PPVE/CAH copolymer, a TFE/HFP/IAH copolymer, a TFE/HFP/CAH copolymer, a TFE/VdF/IAH copolymer, a TFE/VdF/CAH copolymer, a TFE/$CH_2$=$CH(CF_2)_4F$/IAH/ethylene copolymer, a TFE/$CH_2$=$CH(CF_2)_4F$/CAH/ethylene copolymer, a TFE/$CH_2$=$CH(CF_2)_2F$/IAH/ethylene copolymer and a TFE/$CH_2$=$CH(CF_2)_2F$/CAH/ethylene copolymer.

The fluorinated copolymer (A) may be produced by a conventional method.

As a method for producing the fluorinated copolymer (A) having the functional groups (I), for example, (1) a method of using a monomer having the functional group (I) when the fluorinated copolymer (A) is produced by the polymerization reaction, (2) a method of producing the fluorinated copolymer (A) by a polymerization reaction using a radical polymerization initiator or a chain transfer agent containing the functional group (I), (3) a method of heating a fluorinated copolymer having no functional group (I) to partially thermally decompose the fluorinated copolymer to form reactive functional groups (such as carbonyl groups) to obtain the fluorinated copolymer (A) having the functional groups (I) or (4) a method of graft-polymerizing a monomer having the functional group (I) to a fluorinated copolymer having no functional group (I) to introduce the functional groups (I) to the fluorinated copolymer may, for example, be mentioned.

As the method for producing the fluorinated copolymer (A), the method (1) is preferred.

In a case where the fluorinated copolymer (A) is produced by a polymerization reaction, the polymerization reaction is not particularly limited and is preferably, for example, a polymerization method using a radical polymerization initiator.

The polymerization method may, for example, be bulk polymerization, solution polymerization using an organic solvent such as a fluorinated hydrocarbon, a chlorinated hydrocarbon, a chlorofluorohydrocarbon, an alcohol or a hydrocarbon, suspension polymerization using an aqueous medium and as the case requires a proper organic solvent, or emulsion polymerization using an aqueous medium and an emulsifier, and is preferably solution polymerization.

The radical polymerization initiator is preferably an initiator of which the temperature at which the half-life is 10 hours is from 0 to 100° C., more preferably from 20 to 90° C.

It may, for example, be specifically an azo compound such as azobisisobutyronitrile; a non-fluorinated diacyl peroxide such as isobutyryl peroxide, octanoyl peroxide, benzoyl peroxide or lauroyl peroxide; a peroxydicarbonate such as diisopropyl peroxydicarbonate; a peroxyester such as tert-butyl peroxypivalate, tert-butyl peroxyisobutyrate or tert-butyl peroxyacetate; a fluorinated diacyl peroxide such as a compound represented by $(Z(CF_2)_rCOO)_2$ (wherein Z is a hydrogen atom, a fluorine atom or a chlorine atom, and r is an integer of from 1 to 10); or an inorganic peroxide such as potassium persulfate, sodium persulfate or ammonium persulfate.

At the time of polymerization, it is also preferred to use a chain transfer agent so as to control the melt viscosity of the fluorinated copolymer (A).

The chain transfer agent may be an alcohol such as methanol or ethanol, a chlorofluorohydrocarbon such as 1,3-dichloro-1,1,2,2,3-pentafluoropropane or 1,1-dichloro-1-fluoroethane, or a hydrocarbon such as pentane, hexane or cyclohexane.

As described above, a compound having the functional group (I) may be used as at least one of the radical polymerization initiator and the chain transfer agent, whereby the functional groups (I) may be introduced to the terminal of the main chain of the obtainable fluorinated copolymer (A).

Such a radical polymerization initiator may, for example, be di-n-propyl peroxydicarbonate, diisopropyl peroxycarbonate, t-butyl peroxyisopropylcarbonate, bis(4-t-butylcyclohexyl) peroxydicarbonate or di-2-ethylhexyl peroxydicarbonate, and the chain transfer agent may, for example, be acetic acid, acetic anhydride, methyl acetate, ethylene glycol or propylene glycol.

The organic solvent used for solution polymerization may, for example, be a perfluorocarbon, a hydrofluorocarbon, a chlorohydrofluorocarbon or a hydrofluoroether. The number of carbon atoms is preferably from 4 to 12.

The perfluorocarbon may, for example, be specifically perfluorocyclobutane, perfluoropentane, perfluorohexane, perfluorocyclopentane or perfluorocyclohexane.

The hydrofluorocarbon may, for example, be specifically 1-hydroperfluorohexane. The chlorohydrofluorocarbon may, for example, be specifically 1,3-dichloro-1,1,2,2,3-pentafluoropropane.

The hydrofluoroether may, for example, be specifically methyl perfluorobutyl ether, 2,2,2-trifluoroethyl 2,2,1,1-tetrafluoroethyl ether.

The polymerization conditions are not particularly limited, and the polymerization temperature is preferably from 0 to 100° C., more preferably from 20 to 90° C. The polymerization pressure is preferably from 0.1 to 10 MPa, more preferably from 0.5 to 3 MPa. The polymerization time is preferably from 1 to 30 hours.

In a case where the fluorinated copolymer (A) having structural units (a2) is produced by polymerization, the concentration of the cyclic hydrocarbon monomer having an acid anhydride residue and a polymerizable unsaturated bond during polymerization is preferably from 0.01 to 5 mol %, more preferably from 0.1 to 3 mol %, most preferably from 0.1 to 2 mol % based on all the monomers. When the concentration of the monomer is within the above range, the polymerization rate at the time of production will be appropriate. If the concentration of the monomer is too high, the polymerization rate tends to decrease.

During polymerization, as the cyclic hydrocarbon monomer having an acid anhydride residue and a polymerizable unsaturated bond is consumed by polymerization, the monomer in a consumed amount is preferably supplied to the polymerization tank continuously or intermittently to maintain the concentration of the monomer to be within the above range.

In the fluorinated resin layer, one type of the fluorinated copolymer (A) may be contained, or two or more types of the fluorinated copolymer (A) may be contained.

The content of the fluorinated copolymer (A) in the fluorinated resin layer is preferably at least 50 mass %, more preferably at least 80 mass % based on the total mass of the fluorinated resin layer in view of the adhesion of the fluorinated resin layer to the polyimide film and the metal foil. The upper limit of the content is not particularly limited and may be 100 mass %.

The fluorinated resin layer may contain a resin other than the fluorinated copolymer (A) as the case requires within a range not to impair the effects of the present invention.

The resin other than the fluorinated copolymer (A) is not particularly limited so long as electrical reliability is not impaired, and it may, for example, be a fluorinated copolymer other than the fluorinated copolymer (A), an aromatic polyester, a polyamidimide or a thermoplastic polyimide.

The fluorinated copolymer other than the fluorinated copolymer (A) may, for example, be a tetrafluoroethylene/fluoroalkyl vinyl ether copolymer, a tetrafluoroethylene/hexafluoropropylene copolymer or an ethylene/tetrafluoroethylene copolymer.

The resin other than the fluorinated copolymer (A) is preferably a fluorinated copolymer other than the fluorinated copolymer (A) from the viewpoint of electrical reliability. In such a case, if the fluorinated copolymer has a melting point of at least 280° C. and at most 320° C., blisters (foaming) in the fluorinated resin layer due to heat tends to be suppressed when the adhesive film is exposed to an atmosphere corresponding to reflow soldering.

The content of the resin other than the fluorinated copolymer (A) is from 0.01 to 20 mass %, preferably from 0.1 to 10 mass % based on the total mass of the fluorinated resin layer. The content within the above range is preferred in view of excellent handling efficiency at the time of film operation.

The fluorinated resin layer may contain an additive as the case requires within a range not to impair the effects of the present invention.

The additive is preferably an inorganic filler having a low dielectric constant and a low dielectric loss tangent. Such an inorganic filler may, for example, be silica, clay, talc, calcium carbonate, mica, diatomaceous earth, alumina, zinc oxide, titanium oxide, calcium oxide, magnesium oxide, iron oxide, tin oxide, antimony oxide, calcium hydroxide, magnesium hydroxide, aluminum hydroxide, basic magnesium carbonate, magnesium carbonate, zinc carbonate, barium carbonate, dawsonite, hydrotalcite, calcium sulfate, barium sulfate, calcium silicate, montmorillonite, bentonite, activated clay, sepiolite, Imogolite, sericite, glass fibers, glass beads, silica balloons, carbon black, carbon nanotubes, carbon nanohorns, graphite, carbon fibers, glass balloons, carbon balloons, wood flour or zinc borate. Such inorganic fillers may be used alone or in combination of two or more.

The inorganic filler may be porous or non-porous. It is preferably porous, in view of lower dielectric constant and dielectric loss tangent.

The inorganic filler may be surface-treated with a surface treating agent such as a silane coupling agent or a titanate coupling agent for the purpose of improving dispersibility into the fluorinated copolymer (A).

In a case where the inorganic filler is contained, the content of the inorganic filler in the fluorinated resin layer is preferably from 0.1 to 100 parts by mass, more preferably from 0.1 to 60 parts by mass per 100 parts by mass of the fluorinated copolymer (A).

The thickness of the fluorinated resin layer is from 1 to 20 µm, preferably from 3 to 20 µm, particularly preferably from 3 to 15 µm.

When the thickness of the fluorinated resin layer is at most the upper limit value of the above range, the adhesive film can be made thin. When it is at least the lower limit value of the above range, the fluorinated resin layer is less likely to have blisters (foaming) when the adhesive film is exposed to an atmosphere corresponding to reflow soldering at high temperature. Further, the entire adhesive film can be made thin. When the thickness of the fluorinated resin layer is at least the lower limit value of the above range, excellent electrical insulating properties are achieved.

The thickness of the fluorinated resin layer is preferably from 6 to 15 μm so as to achieve both soldering iron resistance at high temperature and reduction of transmission loss of the flexible printed circuit board.

In a case where the polyimide film has the fluorinated resin layer on both sides, the thickness of the fluorinated resin layer is a thickness on one side, not the total thickness on both sides.

The fluorinated resin layer may be laminated only on one side of the polyimide film or may be laminated on both sides. The fluorinated resin layer is laminated preferably on both sides of the polyimide film, with a view to suppressing warpage of the adhesive film, obtaining a double-sided metal flexible laminate excellent in the electrical reliability, etc.

In a case where the fluorinated resin layer is laminated on both sides of the polyimide film, the compositions (the type of the fluorinated copolymer (A), the type of optional components and their contents, etc.) and the thicknesses of the respective fluorinated resin layers may be the same or different. The compositions and the thicknesses of the fluorinated resin layers are preferably the same, with a view to suppressing warpage of the adhesive film.

(Polyimide Film)

The polyimide film is a film made of a polyimide.

The polyimide film may contain an additive as the case requires within a range not to impair the effects of the present invention.

The polyimide constituting the polyimide film is not particularly limited. It may be a polyimide having no thermoplasticity or may be a thermoplastic polyimide.

The polyimide may, for example, be preferably an aromatic polyimide. Particularly preferred is a fully aromatic polyimide produced by polycondensation of an aromatic polyvalent carboxylic acid dianhydride and an aromatic diamine.

The polyimide is generally obtained by a reaction (polycondensation) of a polyvalent carboxylic acid dianhydride (or its derivative) and a diamine via a polyamic acid (polyimide precursor).

A polyimide particularly an aromatic polyimide is insoluble in a solvent or the like due to its stiff main chain structure, and is infusible. Accordingly, first, a polyvalent carboxylic acid dianhydride and a diamine are reacted to prepare a polyimide precursor (a polyamic acid or a polyamide acid) soluble in an organic solvent, and the polyamic acid is subjected to forming by various methods. Then, the polyamic acid is dehydrated by heating or by a chemical method to be cyclized (imidized) to obtain a polyimide.

The aromatic polyvalent carboxylic acid dianhydride may, for example, be specifically pyromellitic dianhydride, 3,3',4,4'-benzophenonetetracarboxylic dianhydride, 2,2',3,3'-benzophenonetetracarboxylic dianhydride, 3,3',4,4'-biphenyltetracarboxylic dianhydride, 2,2',3,3'-biphenyltetracarboxylic dianhydride, 2,2-bis(2,3-dicarboxyphenyl)propane dianhydride, bis(3,4-dicarboxyphenyl)ether dianhydride, bis(3,4-dicarboxyphenyl)sulfone dianhydride, 1,1-bis(2,3-dicarboxyphenyl)ethane dianhydride, bis(2,3-dicarboxyphenyl)methane dianhydride, bis(3,4-dicarboxyphenyl)methane dianhydride, 2,2-bis(3,4-dicarboxyphenyl)-1,1,1,3,3,3-hexafluoropropane dianhydride, 2,3,6,7-naphthalenetetracarboxylic dianhydride, 1,4,5,8-naphthalenetetracarboxylic dianhydride, 1,2,5,6-naphthalenetetracarboxylic dianhydride, 1,2,3,4-benzenetetracarboxylic dianhydride, 3,4,9,10-perylenetetracarboxylic dianhydride, 2,3,6,7-anthracenetetracarboxylic dianhydride or 1,2,7,8-phenanthrenetetracarboxylic dianhydride.

Further, ethylenetetracarboxylic dianhydride or cyclopentanetetracarboxylic dianhydride which is a non-aromatic polyvalent carboxylic acid dianhydride may be used equivalently to the aromatic polyvalent carboxylic acid dianhydride.

They may be used alone or in combination of two or more.

The aromatic diamine may, for example, be specifically m-phenylenediamine, o-phenylenediamine, p-phenylenediamine, m-aminobenzylamine, p-aminobenzylamine, 4,4'-diaminodiphenyl ether, 3,3'-diaminodiphenyl ether, 3,4'-diaminodiphenyl ether, bis(3-aminophenyl)sulfide, (3-aminophenyl)(4-aminophenyl)sulfide, bis(4-aminophenyl)sulfide, bis(3-aminophenyl)sulfide, (3-aminophenyl)(4-aminophenyl)sulfoxide, bis(3-aminophenyl)sulfone, (3-aminophenyl)(4-aminophenyl)sulfone, bis(4-aminophenyl)sulfone, 3,3'-diaminobenzophenone, 3,4'-diaminobenzophenone, 4,4'-diaminobenzophenone, 3,3'-diaminodiphenylmethane, 3,4'-diaminodiphenylmethane, 4,4'-diaminodiphenylmethane, bis[4-(3-aminophenoxy)phenyl]methane, bis[4-(4-aminophenoxy)phenyl]methane, 1,1-bis[4-(3-aminophenoxy)phenyl]ethane, 1,1-bis[4-(4-aminophenoxy)phenyl]-ethane, 1,2-bis[4-(3-aminophenoxy)phenyl]ethane, 1,2-bis[4-(4-aminophenoxy)phenyl]ethane, 2,2-bis[4-(3-aminophenoxy)phenyl]propane, 2,2-bis[4-(4-aminophenoxy)phenyl]propane, 2,2-bis[4-(3-aminophenoxy)phenyl]butane, 2,2-bis[3-(3-aminophenoxy)phenyl]-1,1,1,3,3,3-hexafluoropropane, 2,2-bis[4-(4-aminophenoxy)phenyl]-1,1,1,3,3,3-hexafluoropropane, 1,3-bis(3-aminophenoxy)benzene, 1,3-bis(4-aminophenoxy)benzene, 1,4-bis(3-aminophenoxy)benzene, 1,4-bis(4-aminophenoxy)benzene, 4,4'-bis(3-aminophenoxy)biphenyl, 4,4'-bis(4-aminophenoxy)biphenyl, bis[4-(3-aminophenoxy)phenyl]ketone, bis[4-(4-aminophenoxy)phenyl]ketone, bis[4-(3-aminophenoxy)phenyl]sulfide, bis[4-(4-aminophenoxy)phenyl]sulfide, bis[4-(3-aminophenoxy)phenyl]sulfoxide, bis[4-(4-aminophenoxy)phenyl]sulfoxide, bis[4-(3-aminophenoxy)phenyl]sulfone, bis[4-(4-aminophenoxy)phenyl]sulfone, bis[4-(3-aminophenoxy)phenyl]ether, bis[4-(4-aminophenoxy)phenyl]ether, 1,4-bis[4-(3-aminophenoxy)benzoyl]benzene, 1,3-bis[4-(3-aminophenoxy)benzoyl]benzene, 4,4'-bis[3-(4-aminophenoxy)benzoyl]diphenyl ether, 4,4'-bis[3-(3-aminophenoxy)benzoyl]diphenyl ether, 4,4'-bis[4-(4-amino-α,α-dimethylbenzyl)phenoxy]benzophenone, 4,4'-bis[4-(4-amino-α,α-dimethylbenzyl)phenoxy]diphenylsulfone, bis[4-{4-(4-aminophenoxy)phenoxy}phenyl]sulfone, 1,4-bis[4-(4-aminophenoxy)phenoxy]-α,α-dimethylbenzyl]benzene, or 1,3-bis[4-(4-aminophenoxy)-α,α-dimethylbenzyl]benzene. They may be used alone or in combination of two or more.

The additive which the polyimide film may contain is preferably an inorganic filler having a low dielectric constant and a low dielectric loss tangent. Such an inorganic filler may be the same inorganic filler described for the fluorinated resin film. The inorganic fillers may be used alone or in combination of two or more.

The inorganic filler may be porous or non-porous. It is preferably porous, in view of lower dielectric constant and dielectric loss tangent.

The inorganic filler may be surface-treated with a surface treating agent such as a silane coupling agent or a titanate coupling gent for the purpose of improving dispersibility into the polyimide.

In a case where the inorganic filler is contained, the content of the inorganic filler in the polyimide film is preferably from 0.1 to 100 mass %, more preferably from 0.1 to 60 mass % based on the polyimide.

The thickness of the polyimide film is preferably from 3 to 50 µm, more preferably from 5 to 25 µm, particularly preferably from 6 to 25 µm.

When the thickness of the polyimide film is at least the lower limit value of the above range, excellent electrical insulating properties will be achieved, and when it is at most the upper limit value of the above range, the entire adhesive film can be made thin.

The polyimide film is preferably thicker than the fluorinated resin layer. That is, the fluorinated resin layer is preferably thinner than the polyimide film. By such thicknesses, blisters (foaming) in the fluorinated resin layer are more effectively suppressed when the adhesive film is exposed to an atmosphere corresponding to reflow soldering at high temperature.

The thickness of the polyimide film is preferably larger than the thickness of the fluorinated resin layer, more preferably at least 1.25 times and at most 25 times, particularly preferably from 1.66 times and at most 8.3 times.

(Thickness of Adhesive Film)

The thickness of the entire adhesive film is preferably at most 150 µm. For applications for which high bending property is required, it is preferably from 5 to 75 µm.

The thinner the entire adhesive film is, the more the flexibility will improve, and the lighter the mass per unit area will be.

The thickness of the entire adhesive film, the thickness of the fluorinated resin layer and the thickness of the polyimide film are measured by e.g. a micrometer, although the measuring method is not particularly limited.

(Method for Producing Adhesive Film)

The adhesive film of the present invention may be produced by laminating the fluorinated resin layer on one side or on both sides of the polyimide film.

The polyimide film may be prepared by a known production method, or may be a commercially available product.

A surface treatment may be applied to the surface of the polyimide film, for example, to the surface on which the fluorinated resin layer is to be laminated. The surface treatment method is not particularly limited and may be properly selected from known surface treatment methods such as corona discharge treatment and plasma treatment.

The method of laminating the fluorinated resin layer is not particularly limited so long as the fluorinated resin layer can be directly laminated on the polyimide film, and is preferably a heat lamination method or an extrusion lamination method with a view to improving electrical properties and heat resistance of the adhesive film.

By the heat lamination method, a preliminarily formed fluorinated resin film and a polyimide film are overlaid and subjected to hot pressing to laminate these films.

By the extrusion lamination method, the fluorinated copolymer (A) or a resin composition containing it is molten and extruded into a film, which is laminated on the polyimide film.

Forming of the fluorinated resin film may be carried out by a conventional method. For example, the fluorinated copolymer (A) as it is, or a resin composition obtained by mixing and kneading the fluorinated copolymer (A) and additives is formed into a film by a known forming method such as extrusion or inflation molding to obtain a fluorinated resin film.

A surface treatment may be applied to the surface of the fluorinated resin film, for example, the surface to be laminated on the polyimide film. The surface treatment method is not particularly limited, and may be properly selected from known surface treatment methods such as corona discharge treatment and plasma treatment.

As the hot pressing conditions in the heat lamination method, the temperature is preferably from 295 to 420° C., more preferably from 300 to 400° C. The pressure is preferably from 0.3 to 30 MPa, more preferably from 0.5 to 20 MPa, most preferably from 1 to 10 MPa. The time is preferably from 3 to 240 minutes, more preferably from 5 to 120 minutes, most preferably from 10 to 80 minutes. Hot pressing may be carried out by e.g. a pressing plate or a roll. The pressing plate is preferably a stainless steel plate.

[Flexible Metal Laminate]

The flexible metal laminate of the present invention comprises the above-described adhesive film of the present invention, and a metal foil directly laminated on the fluorinated resin layer of the adhesive film.

In a case where the adhesive film has the fluorinated resin layer laminated on both sides of the polyimide film, the metal foil may be laminated either on one side or on both sides of the adhesive film.

The metal foil is not particularly limited and may be properly selected depending upon the application. For example, in a case where the flexible metal laminate of the present invention is used for electronic equipment and electrical apparatus application, the metal foil may be a foil made of copper or a copper alloy, stainless steel or its alloy, nickel or a nickel alloy (including 42 alloy), or aluminum or an aluminum alloy. For such an application, for a conventional flexible metal laminate, a copper foil such as a rolled copper foil or an electrolytic copper foil is heavily used, and such a copper foil may be preferably used also in the present invention.

On the surface of the metal foil, an anti-corrosive layer (for example, an oxide coating film of e.g. chromate) or a heat resistant layer may be formed. Further, a coupling agent treatment or the like may be applied to the surface of the metal foil so as to improve the adhesion to the fluorinated resin layer.

The thickness of the metal foil is not particularly limited so long as the flexible metal laminate can exercise sufficient functions depending upon its application.

The flexible metal laminate of the present invention may be produced by bonding the metal foil to the fluorinated resin layer of the adhesive film.

Bonding of the adhesive film and the metal foil may be carried out by a known method. For example, the adhesive film and the metal foil can be bonded by continuous treatment by a heated roll lamination apparatus having at least one pair of metal rolls, or a double belt press (DBP). Bonding of the adhesive film and the metal foil is preferably carried out by heat lamination using a heated roll lamination apparatus having at least one pair of metal rolls, in view of simple apparatus structure and the advantage in the maintenance cost.

The "heated roll lamination apparatus having at least one pair of metal rolls" is any apparatus having metal rolls for heat-pressurizing the material and its specific apparatus structure is not particularly limited.

The specific structure of the means to conduct heat lamination is not particularly limited, however, it is preferred to dispose a protective material between the surface to be pressurized and the metal foil in order that the obtainable laminate has a favorable outer appearance.

The protective material is not particularly limited so long as it withstands the heating temperature in the heat lamination step, and it is suitably a heat resistant plastic such as a non-thermoplastic polyimide film, or a metal foil such as a copper foil, an aluminum foil or a SUS foil. Among them, a non-thermoplastic polyimide film is more preferably used in view of an excellent balance of heat resistance, recyclability, etc. Further, the thickness of the non-thermoplastic polyimide film is preferably at least 75 μm, since if the film is thin, the film may not sufficiently fulfill cushioning and protecting functions at the time of lamination. Further, the protective material does not necessarily consist of one layer, and it may have a multilayer structure consisting of two or more layers having different properties.

In the above heat lamination means, the method of heating the material to be laminated is not particularly limited, and a heating means employing a conventional method capable of heating at a predetermined temperature, such as a heat circulation method, a hot air heating method or a dielectric heating method may be employed. Further, the method of pressurizing the material to be laminated in the heat lamination means is also not particularly limited, and a pressurizing means employing a conventional method capable of applying a predetermined pressure, such as a hydraulic method, an air pressure method or a pressure-between-gaps method may be employed.

The heating temperature in the above heat lamination step, i.e. the lamination temperature is preferably a temperature of at least the glass transition temperature (Tg) of the adhesive film +50° C., more preferably at least Tg of the adhesive film +100° C. At a temperature of at least Tg+50° C., the adhesive film and the metal foil can be favorably heat-laminated. Further, at a temperature of at least Tg+100° C., the lamination rate can be increased to further improve the productivity.

Further, Tg of the adhesive film means Tg of the resin (the fluorinated copolymer (A) or a mixed resin of the fluorinated copolymer (A) and another resin) constituting the fluorinated resin layer of the adhesive film, to which the metal foil is to be bonded.

Further, in the present invention, the above heating temperature is at least 370° C. and at most 420° C., preferably at most 420° C., more preferably at most 400° C.

The adhesive film of the present invention has the fluorinated resin layer provided on one side or on both sides of the polyimide film, and it thereby has adhesion to the metal foil. In the case of a common adhesive film employing a thermoplastic polyimide for the adhesive layer, it is necessary to heat it to high temperature of about 400° C. in some cases so as to develop heat sealing properties. Accordingly, a flexible metal laminate obtained by heat lamination may have permanent set, and when etching is carried out to form wirings and when reflow soldering is carried out to mount members, the permanent set may lead to a dimensional change in some cases.

Further, the adhesive film of the present invention has the fluorinated resin layer having adhesion to the metal foil on its surface, and accordingly by heat laminating it at a relatively low temperature of at most 400° C., a flexible metal laminate having the adhesive film and the metal foil sufficiently contact-bonded can be obtained. The above dimensional change can be suppressed by carrying out heat lamination at low temperature.

The lamination rate in the above heat lamination step is preferably at least 0.5 m/min, more preferably at least 1.0 m/min. When it is at least 0.5 m/min, sufficient heat lamination is possible, and when it is at least 1.0 m/min, the productivity will further improve. Usually, the lamination rate is at most 50 m/min.

A higher pressure in the heat lamination step i.e. lamination pressure is advantageous in that the lamination temperature can be lowered and the lamination rate can be increased. However, if the lamination pressure is too high, the dimensional change of the obtainable laminate tends to be significant. Further, if the lamination pressure is too low, the adhesive strength of the metal foil of the obtainable laminate will be low. Accordingly, the lamination pressure is preferably within a range of from 49 to 1,764 N/cm (from 5 to 180 kgf/cm), more preferably from 98 to 1,740 N/cm (from 10 to 150 kgf/cm). Within such a range, three conditions of the lamination temperature, the lamination rate and the lamination pressure will be favorable, and the productivity will further improve.

In production of the flexible metal laminate of the present invention, it is preferred to use a heat lamination apparatus of continuously contact-bonding the material to be laminated with heating, such as the above-described heated roll lamination apparatus having at least one pair of metal rolls. In such a heat lamination apparatus, a feeding means of feeding the material to be laminated may be provided at a stage prior to the heat lamination means (such as at least one pair of metal rolls), and a winding means of winding the material to be laminated may be provided at a stage after the heat lamination means. By such means, the productivity of the heat lamination apparatus will further improve. Specific structures of the feeding means and the winding means are not particularly limited, and for example, a known roll-form winding machine capable of winding the adhesive film and the metal foil, or the obtainable laminate.

Further, it is more preferred to provide a protective material-winding means or a protective material-feeding means of winding or feeding the protective material. By such a protective material-winding means or a protective material-feeding means, it is possible to recycle the protective material by winding the protective material once used in the heat lamination step and providing it again to the feeding side.

Further, it is possible to provide an edge position detection means and a winding position correction means to arrange both ends of the protective material. By such means, the protective material can be wound while both ends are arranged precisely, whereby the recycle efficiency can be increased. The specific structures of such a protective material-winding means, a protective material-feeding means, an edge position detection means and a winding position correction means are not particularly limited, and conventional apparatus may be used.

As mentioned above, after the adhesive film and the metal foil are bonded, the metal foil may be etched to form a desired pattern.

The flexible printed circuit board of the present invention means one having a conductor layer (a conductor circuit layer) formed on one side or on both sides of the adhesive film.

By etching the metal foil to form wirings with a desired pattern, the flexible printed circuit board may be used as a flexible circuit board having various downsized high-densification members mounted. Needless to say, applications of the present invention are not limited thereto, and the flexible printed circuit board can be used for various applications so long as it is a laminate having a metal foil.

Etching may be chemical etching (wet etching), and an etching liquid may be a copper chloride solution, nitric acid or the like, or another acidic solution, an alkali solution or the like may be used.

When the adhesive film or the flexible metal laminate of the present invention is subjected to heat treatment at 370° C. or higher e.g. by heat lamination, MFR of the fluorinated resin layer tends to be lowered. By such heat treatment, the heat resistance of the fluorinated copolymer (A) will improve. The heat treatment temperature is at least 370° C. and at most 420° C., preferably at least 380° C. By such heat treatment, for example, the flexible metal laminate has improved solder iron heat resistance.

Usually, the fluorinated copolymer tends to have a low molecular weight and high MFR by decomposition. However, it is considered that when the fluorinated copolymer (A) of the present invention or a resin composition containing the fluorinated copolymer (A) is heated to a moderate temperature (at least 370° C. and at most 400° C.), unreacted functional groups undergo further polymerization reaction at the initial stage, thus increasing the molecular weight or increasing the viscosity by the crosslinking reaction, whereby a decrease of MFR is induced and thus the heat resistance is improved.

[Function and Effects]

The fluorinated resin layer in the adhesive film of the present invention, which contains the fluorinated copolymer (A) having functional groups (I), is well contact-bonded to the polyimide film and the metal foil. Accordingly, the polyimide film and the metal foil can be laminated to the fluorinated resin layer without using an adhesive. This is considered to be because the functional groups (I) interact with the functional groups of the polyimide, for example, carbonyl groups, or with metal atoms, in some form (for example, chemical reaction).

In the adhesive film of the present invention, the polyimide film and the fluorinated resin layer are directly laminated with favorable adhesion, and further, by directly laminating the metal foil on the fluorinated resin layer of the adhesive film, a flexible metal laminate can be obtained. In the flexible metal laminate, the fluorinated resin layer functions as an adhesive layer to bond the polyimide film and the metal foil.

The flexible metal laminate of the present invention, having a metal foil directly laminated on the fluorinated resin layer of the adhesive film of the present invention, which employs the fluorinated resin layer as the adhesive layer, is excellent in heat resistance, bending property, electrical reliability, etc. as compared with a case where a thermosetting adhesive is used for the adhesive layer.

Further, the fluorinated copolymer (A) has low dielectric properties (e.g. dielectric constant and dielectric loss tangent) as compared with a thermoplastic polyimide, and the fluorinated resin layer containing the fluorinated copolymer (A) has excellent electrical insulating properties. The flexible metal laminate of the present invention, which employs such a fluorinated resin layer as the adhesive layer, can achieve a high signal transfer rate, a low transmission loss, etc. as compared with a conventional flexible metal laminate using a thermoplastic polyimide for the adhesive layer.

Further, in the flexible metal laminate of the present invention, the fluorinated resin layer directly in contact with the polyimide film, is less likely to have blisters (foaming) due to heating at the time of reflow soldering. Accordingly, even after the reflow soldering step, the shape, electrical properties, etc. of the pattern wiring formed on the fluorinated resin layer are maintained as designed.

The reason why the fluorinated resin layer is less likely to have blisters due to heat are considered as follows. The polyimide film has high moisture absorption, and the fluorinated resin layer has low moisture absorption. If the polyimide film contains water, the water is formed into water vapor at the time of reflow soldering.

If the thickness of the fluorinated resin layer exceeds 20 μm, such a fluorinated resin layer has gas barrier properties (water vapor barrier properties), and water vapor at high temperature generated from the polyimide film stays at the interface between the polyimide film and the fluorinated resin layer to form blisters in the fluorinated resin layer.

It is considered that the flexible metal laminate of the present invention is less likely to have the above blisters since the thickness of the fluorinated resin layer is at most 20 μm, and water vapor is transmitted through the fluorinated resin layer to a certain extent.

Further, the thickness of the flexible metal laminate of the present invention is at most 200 μm, preferably from 10 to 150 μm, and particularly in applications in which high flex resistance is required, it is preferably from 10 to 120 μm.

The present invention further provides a flexible printed circuit board having a pattern circuit formed by etching the metal foil of the flexible metal laminate.

A microstrip line including a microstrip transmission line formed by etching the metal foil of the flexible metal laminate, is such that the transmission loss [a] after the following conditioning [a] and the transmission loss ([b]) after the following conditioning [b], measured at a temperature of from 20 to 25° C. under a humidity of from 40 to 60% RH after the following conditioning [a] or [b], preferably satisfy ([b]−[a])<0.004 dB/mm, more preferably [b]−[a] <0.003 dB/mm, further preferably [b]−[a]<0.002 dB/mm.

[a]: firing at a temperature of 105° C. for 48 hours;

[b]: firing at a temperature of 105° C. for 24 hours and storing at a temperature of 60° C. under a humidity of 90% RH for 24 hours.

In the present invention, conditions of measuring the transmission loss are as described in "(6) transmission loss (dB/mm)" disclosed in Examples.

The transmission line in the present invention, which has the above excellent dielectric properties, is effectively used as various electrical transmission lines such as a coaxial cable and a strip line. Particularly, it is suitably used as a transmission line for which flex resistance and low moisture absorption are required when used.

Further, in production of a flexible printed circuit board including a step using a solder iron on a pattern circuit, the solder iron can be handled at high temperature.

The flexible printed circuit board of the present invention, which has excellent electrical properties, is suitably used for various electrical apparatus, electronic equipment, communication equipment, etc.

EXAMPLES

Now, the present invention will be described in further detail with reference to Examples. However, the present invention is by no means restricted to such specific Examples.

Methods for measuring physical properties of the fluorinated copolymer are shown below.

(1) Copolymer Composition

The copolymer composition of the fluorinated copolymer (A) was determined by melt NMR analysis, fluorine content analysis and infrared absorption spectrum analysis.

(2) Content of Reactive Functional Groups

The proportion of structural units derived from NAH having a reactive functional group in the fluorinated copolymer (A) was determined by the following infrared absorption spectrum analysis.

The fluorinated copolymer (A) was press-formed to obtain a 200 μm film. In an infrared absorption spectrum of the obtained film, an absorption peak of the structural unit derived from NAH in the fluorinated copolymer appears at 1,778 cm$^{-1}$. The absorbance of the absorption peak was measured, and the proportion (mol %) of the structural units derived from NAH was obtained by the molar absorption coefficient of NAH of 20,810 mol$^{-1}$·1·cm$^{-1}$.

The number of the reactive functional groups (acid anhydride groups) per $1 \times 10^6$ carbon atoms in the main chain is calculated as [a×10$^6$/100] groups, where a (mol %) is the above proportion.

(3) Melting Point (° C.)

Using a differential scanning calorimeter (DSC apparatus) manufactured by Seiko Instruments & Electronics Ltd., the melt peak when the fluorinated copolymer (A) was heated at a rate of 10° C./min was recorded, and the temperature (° C.) corresponding to the local maximum value was taken as the melting point (Tm).

(4) MFR (g/10 min)

Using a melt indexer manufactured by TECHNOL SEVEN CO., LTD., the mass (g) of the fluorinated copolymer (A) flowing out in 10 minutes (unit time) from a nozzle having a diameter of 2 mm and a length of 8 mm under a load of 5 kg (49 N) at 372° C. which is higher by at least 20° C. than the melting point, was measured.

(5) Solder Iron Heat Resistance Test (° C.)

On a copper foil surface on one side of a flexible double-sided metal laminate, 18 sample pads in a longitudinal direction and 18 sample pads in a transverse direction, i.e. totally 289 sample pads of 2 mm in diameter were formed by etching, and the copper foil on the other portion was removed by etching. A solder iron (manufactured by HAKKO Corporation, model HAKKO942) was set to a specific temperature and pressed against the sample pads for 10 seconds, and abnormalities such as blisters and peeling were visually observed.

The above operation was carried out at solder iron set temperatures of 300° C., 310° C., 320° C., 330° C., 340° C. and 350° C. For example, when no abnormalities were observed at 330° C. and abnormalities such as blisters or peeling were visually observed at 340° C., the solder iron heat resistance was rated at 330° C.

(6) Transmission Loss (dB/mm)

To measure the transmission loss, a microstrip line with an impedance Z=50Ω was used. A microstrip line is widely used for measurement of the transmission loss since it has a structure suitable for mounting of surface mount components and it is easily prepared.

FIG. 1 is a cross-sectional view illustrating one example of a microstrip line. A microstrip line 30 has an electrical insulator layer (A) 22 consisting of the adhesive film, a microstrip transmission line 32 formed by subjecting an electrical conductor layer (B) on one side of the electrical insulator layer (A) to etching and then copper plating, and a ground layer 34 consisting of an electrical conductor layer (B) on the other surface of the electrical insulator layer (A).

The microstrip line 30 was subjected to the following conditioning [a] or [b] to prepare a measurement sample.

[a]: firing at a temperature of 105° C. for 48 hours;

[b]: firing at a temperature of 105° C. for 24 hours and storing at a temperature of 60° C. under a humidity of 90% RH for 24 hours.

Then, both ends of the microstrip transmission line 32 and the ground layer 34 were connected to a measuring apparatus, the amount of transmitted waves based on the incident waves to the microstrip transmission line 32 at 5 GHz was measured, and the transmission loss at a temperature of 23° C. under a humidity of 50% RH after the conditioning [a] or [b] was determined from the following formula.

$$\text{Transmission loss (dB/mm)} = |S21|/L$$

wherein S21 is the amount of the transmitted waves (dB) at 5 GHz based on the incident waves to the microstrip transmission line 32, and L is the line length L (mm) of the microstrip transmission line 32.

Measurement apparatus used for this measurement is as follows. Measurement apparatus: E8363B (manufactured by Agilent Technologies) Measuring frequency: 10 M-40 GHz The conditionings [a] and [b] were carried out under the same conditions except for the above conditions.

Production Example 1

A fluorinated copolymer (A-1) was produced by using NAH (himic anhydride, manufactured by Hitachi Chemical Company, Ltd.) as a monomer forming the structural units (a2) and PPVE (CF$_2$=CFO(CF$_2$)$_3$F, perfluoropropyl vinyl ether, manufactured by Asahi Glass Company, Limited) as a monomer forming the structural units (a3).

First, 369 kg of 1,3-dichloro-1,1,2,2,3-pentafluoropropane (AK225cb, manufactured by Asahi Glass Company, Limited) (hereinafter referred to as "AK225cb") and 30 kg of PPVE were charged to a deaerated polymerization tank having an internal capacity of 430 L equipped with a stirrer. Then, the polymerization tank was heated to 50° C., 50 kg of TFE was charged, and the pressure in the polymerization tank was elevated to 0.89 MPa/G.

Further, a polymerization initiator solution having (perfluorobutyryl) peroxide dissolved at a concentration of 0.36 mass % in AK225cb was prepared, and 3 L of the polymerization initiator solution was continuously added to the polymerization tank at a rate of 6.25 mL per minute to conduct polymerization. Further, TFE was continuously charged so as to maintain a pressure in the polymerization tank during the polymerization reaction of 0.89 MPa/G. Further, a solution having NAH dissolved at a concentration of 0.3 mass % in AK225cb was continuously charged in an amount corresponding to 0.1 mol % based on the number of moles of TFE charged during the polymerization.

8 Hours after initiation of polymerization, at a point when 32 kg of TFE was charged, the temperature in the polymerization tank was lowered to room temperature, and the pressure was purged to normal pressure. The obtained slurry was subjected to solid-liquid separation from AK225cb, followed by drying at 150° C. for 15 hours to obtain 33 kg of a fluorinated copolymer (A-1). The specific gravity of the obtained fluorinated copolymer (A-1) was 2.15.

From the results of melt NMR analysis and infrared absorption spectrum analysis, the fluorinated copolymer (A-1) had a copolymer composition comprising structural units derived from TFE/structural units derived from NAH/structural units derived from PPVE=97.9/0.1/2.0 (mol %). Further, the fluorinated copolymer (A-1) had a melting point of 300° C. and MFR of 17.6 g/10 min.

Further, the content of the reactive functional groups (acid anhydride groups) of the fluorinated copolymer (A-1) was 1,000 groups per $1\times10^6$ carbon atoms in the main chain of the fluorinated copolymer (A-1).

Production Example 2

The fluorinated copolymer (A-1) was extruded by a single screw extruder having a diameter of 30 mm equipped with a coat hanger die having a width of 750 mm at a die temperature of 340° C. to obtain a fluorinated resin film (hereinafter referred to as "film 1") having a thickness of 25 μm.

Production Example 3

A fluorinated resin film (hereinafter referred to as "film 2") having a thickness of 15 μm was obtained in the same manner as in Production Example 2 except that the withdrawing rate was changed.

Production Example 4

A fluorinated resin film (hereinafter referred to as "film 3") having a thickness of 6 μm was obtained in the same manner as in Production Example 2 except that the withdrawing rate was changed.

Production Example 5

A fluorinated resin film (hereinafter referred to as "film 4") having a thickness of 12.5 μm was obtained in the same manner as in Production Example 2 except that the withdrawing rate was changed.

Production Example 6

A fluorinated resin film (hereinafter referred to as "film 5") having a thickness of 7 μm was obtained in the same manner as in Production Example 5 except that the withdrawing rate was changed.

Production Example 7

The fluorinated copolymer (A-1) obtained in Production Example 1 was subjected to heat treatment at 260° C. for 24 hours to obtain a fluorinated copolymer (A-2). The fluorinated copolymer (A-2) had a melting point of 305° C., and MFR of 11.0 g/10 min at 372° C. which is higher by at least 20° C. than the melting point under a load of 49N.

Production Example 8

A fluorinated copolymer (A-3) was obtained in the same manner as in Production Example 1 except that the polymerization time was longer at the time of polymerization of the monomers. The obtained fluorinated copolymer (A-3) had a specific gravity of 2.15.

From the results of melt NMR analysis and infrared absorption spectrum analysis, the fluorinated copolymer (A-3) had a copolymer composition comprising structural units derived from TFE/structural units derived from NAH/ structural units derived from PPVE=97.9/0.1/2.0 (mol %). Further, the fluorinated copolymer (A-3) had a melting point of 301° C. and MFR of 14.8 g/10 min.

Further, the content of the reactive functional groups (acid anhydride groups) of the fluorinated copolymer (A-3) was 1,000 groups per $1\times10^6$ carbon atoms in the main chain of the fluorinated copolymer (A-3).

Production Example 9

The fluorinated copolymer (A-2) was extruded by a single screw extruder having a diameter of 30 mm equipped with a coat hanger die having a width of 750 mm at a die temperature of 340° C. to obtain a fluorinated resin film (hereinafter referred to as "film 6") having a thickness of 12.5 μm.

Production Example 10

The fluorinated copolymer (A-3) was extruded by a single screw extruder having a diameter of 30 mm equipped with a coat hanger die having a width of 750 mm at a die temperature of 340° C. to obtain a fluorinated resin film (hereinafter referred to as "film 7") having a thickness of 12.5 μm.

Example 1

The film 2 and a polyimide film (manufactured by Ube Industries, Ltd., tradename: UPILEX) having a thickness of 25 μm were laminated in the order of film 2/polyimide film/film 2 and pressed at a temperature of 360° C. under a pressure of 10 MPa for 5 minutes to obtain an adhesive film.

The obtained adhesive film was cut into a size of 50 mm×50 mm to prepare three samples, and the samples were put in an oven having an inside temperature controlled to be 280° C. for 1 minute. Then, the samples were taken out and visually observed. As a result, none of the three samples had blisters (foaming) due to heat.

Example 2

The film 3 and a polyimide film (manufactured by Ube Industries, Ltd., tradename: UPILEX) having a thickness of 25 μm were laminated in the order of film 3/polyimide film/film 3 and pressed at a temperature of 360° C. under a pressure of 10 MPa for 5 minutes to obtain an adhesive film.

The obtained adhesive film was cut into a size of 50 mm×50 mm to prepare three samples, and the samples were put in an oven having an inside temperature controlled to be 280° C. for 1 minute. Then, the samples were taken out and visually observed. As a result, none of the three samples had blisters (foaming) due to heat.

Example 3

The film 3 and a polyimide film (manufactured by Ube Industries, Ltd., tradename: UPILEX) having a thickness of 12.5 μm were laminated in the order of film 3/polyimide film/film 3 and pressed at a temperature of 360° C. under a pressure of 10 MPa for 5 minutes to obtain an adhesive film.

The obtained adhesive film was cut into a size of 50 mm×50 mm to prepare three samples, and the samples were put in an oven having an inside temperature controlled to be 280° C. for 1 minute. Then, the samples were taken out and visually observed. As a result, none of the three samples had blisters (foaming) due to heat.

The thicknesses of the polyimide films and the fluorinated resin films (fluorinated resin layers) used in Examples 1 to 3 and evaluation results are shown in Table 1.

As evident from these results, in the adhesive films in Examples 1 to 3 in which the thickness of the fluorinated resin layer laminated on the polyimide film was from 1 to 20 μm, blisters (foaming) in the fluorinated resin layer at a high temperature of 280° C. was suppressed.

TABLE 1

| | Thickness of polyimide film (μm) | Thickness of fluorinated resin layer (μm) | Number of samples with blisters |
|---|---|---|---|
| Example 1 | 25 | 15 | 0/3 |
| Example 2 | 25 | 6 | 0/3 |
| Example 3 | 12.5 | 6 | 0/3 |
| Example 4 | 25 | 15 | 0/3 |

Example 4

The film 2 and a polyimide film (manufactured by Ube Industries, Ltd., tradename: UPILEX) having a thickness of 25 μm were laminated in the order of film 2/polyimide film and pressed at a temperature of 360° C. under a pressure of 10 MPa for 5 minutes to obtain an adhesive film.

The obtained adhesive film was cut into a size of 50 mm×50 mm to prepare three samples, and the samples were put in an oven having an inside temperature controlled to be 280° C. for 1 minute. Then, the samples were taken out and visually observed. As a result, none of the three samples had blisters (foaming) due to heat.

Example 5

The adhesive film obtained in Example 1 and an electrolytic copper foil (manufactured by FUKUDA METAL FOIL & POWDER Co., Ltd., CF-T4X-SVR-12, surface roughness (Rz): 1.2 μm) having a thickness of 12 μm were overlaid in the order of copper foil/adhesive film/copper foil and vacuum pressed at a temperature of 360° C. under a pressure of 3.7 MPa for 10 minutes to obtain a flexible double-sided metal laminate. In the obtained flexible double-sided metal laminate, the copper foil and the adhesive film were sufficiently contact-bonded.

The degree of contact-bonding between the copper foil and the adhesive film was evaluated by the degree of the peel strength obtained as follows.

The flexible metal laminate was cut into a size with a length of 150 mm and a width of 10 mm to prepare a test film. The copper foil and the adhesive film were peeled to a position of 50 mm from one end in the length direction of the test film. Then, the copper foil and the adhesive film were separated to an angle of 90 degree at a pulling rate of 50 mm/min using a tensile tester, and the maximum load was taken as the peel strength (N/10 mm). A higher peel strength indicates more excellent adhesion between the copper foil and the adhesive film.

Example 6

The adhesive film obtained in Example 2 and an electrolytic copper foil (manufactured by FUKUDA METAL FOIL & POWDER Co., Ltd., CF-T4X-SVR-12, Rz: 1.2 μm) having a thickness of 12 μm were overlaid in the order of copper foil/adhesive film/copper foil and vacuum-pressed at a temperature of 360° C. under a pressure of 3.7 MPa for 10 minutes to obtain a flexible double-sided metal laminate. In the obtained flexible double-sided metal laminate, the copper foil and the adhesive film were sufficiently contact-bonded.

Example 7

The adhesive film obtained in Example 4 and an electrolytic copper foil (manufactured by FUKUDA METAL FOIL & POWDER Co., Ltd., CF-T4X-SVR-12, Rz: 1.2 μm) having a thickness of 12 μm were overlaid in the order of copper foil/adhesive film and vacuum-pressed at a temperature of 360° C. under a pressure of 3.7 MPa for 10 minutes to obtain a flexible single-sided metal laminate. In the obtained flexible single-sided metal laminate, the copper foil and the adhesive film were sufficiently contact-bonded.

Example 8

The film 4, a polyimide film (manufactured by DU PONT-TORAY CO., LTD., tradename: Kapton 100EN) having a thickness of 25 μm and an electrolytic copper foil (manufactured by FUKUDA METAL FOIL & POWDER Co., Ltd., CF-T4X-SVR-12, Rz: 1.2 μm) having a thickness of 12 μm were laminated in the order of copper foil/film 4/polyimide film/film 4/copper foil and pressed at a temperature of 360° C. under a pressure of 1.3 MPa for 10 minutes to obtain a flexible double-sided metal laminate.

The obtained flexible double-sided metal laminate was cut into a size of 50 mm×50 mm to prepare three samples, and the samples were put in an oven having an inside temperature controlled to be 280° C. for 1 minute. Then, the samples were taken out and visually observed. As a result, none of the three samples had blisters (foaming) due to heat.

Further, the obtained flexible double-sided metal laminate was subjected to a solder resist heat resistance test, whereupon the heat resistance was 330° C. The results are shown in Table 2.

Further, with respect to the flexible double-sided metal laminates in Examples 9 to 13 and Comparative Examples 1 and 2 also, in the same manner as in Example 8, formation of blisters (foaming) due to heat at 280° C. and the solder iron heat resistance were evaluated. The results are shown in Table 2.

Example 9

A flexible double-sided metal laminate was obtained in the same manner as in Example 8 except that the film 5 was used instead of the film 4.

Comparative Example 1

A flexible double-sided metal laminate was obtained in the same manner as in Example 8 except that the film 1 was used instead of the film 4.

Example 10

A flexible double-sided metal laminate was obtained in the same manner as in Example 8 except that the film 6 was used instead of the film 4.

Example 11

A flexible double-sided metal laminate was obtained in the same manner as in Example 8 except that the film 7 was used instead of the film 4.

Example 12

The flexible double-sided metal laminate obtained in Example 8 was subjected to heat treatment by heated rolls at 400° C. for 1 minute. Of the fluorinated resin layer after the heat treatment, MFR at 372° C. under a load of 49N was 14.4 g/10 min.

Example 13

The flexible double-sided metal laminate obtained in Example 8 was subjected to heat treatment by heated rolls at 360° C. for 1 minute. Of the fluorinated resin layer after the heat treatment, MFR at 372° C. under a load of 49N was 15.9 g/10 min.

Comparative Example 2

The flexible double-sided metal laminate obtained in Comparative Example 1 was subjected to heat treatment by heated rolls at 400° C. for 1 minute. Of the fluorinated resin layer after the heat treatment, MFR at 372° C. under a load of 49N was 14.7 g/10 min.

TABLE 2

| | Thickness of polyimide film (μm) | Thickness of fluorinated resin layer (μm) | Number of samples with blisters | Solder iron heat resistance (° C.) |
|---|---|---|---|---|
| Example 8 | 25 | 12.5 | 0/3 | 330 |
| Example 9 | 25 | 7 | 0/3 | 340 |
| Comparative Example 1 | 25 | 25 | 0/3 | 320 |
| Example 10 | 25 | 12.5 | 0/3 | 340 |
| Example 11 | 25 | 12.5 | 0/3 | 340 |
| Example 12 | 25 | 12.5 | 0/3 | 340 |
| Example 13 | 25 | 12.5 | 0/3 | 330 |
| Comparative Example 2 | 25 | 25 | 0/3 | 320 |

Example 14

With respect to the flexible double-sided metal laminate obtained in Example 10, the transmission losses at 5 GHz were obtained by the method of measuring the transmission loss shown in the above (6).

[a]: transmission loss: 0.0169 dB/mm
[b]: transmission loss: 0.0179 dB/mm
[b]−[a]=0.001 dB/mm

Comparative Example 3

With respect to a flexible double-sided metal laminate having a rolled copper foil (thickness: 18 μm) having a surface roughness (Rz) of 0.8 μm formed on both sides of a polyimide film consisting of a kapton film having a thickness of 50 μm, the transmission losses were obtained in the same manner as in Example 14.

[a]: transmission loss: 0.0212 dB/mm
[b]: transmission loss: 0.0275 dB/mm
[b]−[a]=0.0063 dB/mm

INDUSTRIAL APPLICABILITY

The flexible metal laminate comprising the adhesive film of the present invention is excellent in heat resistance, and a flexible printed circuit board using it has excellent electrical properties and is useful for various electrical apparatus, electronic equipment, communication equipment, etc.

This application is a continuation of PCT Application No. PCT/JP2014/081602 filed on Nov. 28, 2014, which is based upon and claims the benefit of priority from Japanese Patent Application No. 2013-247615 filed on Nov. 29, 2013. The contents of those applications are incorporated herein by reference in their entireties.

REFERENCE SYMBOLS

30: microstrip line
22: electrical insulator (A) layer
32: microstrip transmission line
34: ground layer

What is claimed is:

1. An adhesive film comprising a fluorinated resin layer comprising a fluorinated copolymer (A) directly laminated on both sides of a polyimide film, wherein
the fluorinated copolymer (A) has a melting point of at least 280° C. and at most 320° C., is melt-moldable, and comprises structural units (a1) derived from tetrafluoroethylene, structural units (a2) derived from a cyclic hydrocarbon monomer having an acid anhydride residue and a polymerizable unsaturated bond and structural units (a3) derived from a fluorinated monomer, excluding tetrafluoroethylene, and
the fluorinated resin layer has a thickness of from 1 to 20 μm.

2. The adhesive film according to claim 1, wherein a content of the functional groups is from 10 to 60,000 groups per $1 \times 10^6$ carbon atoms in the main chain of the fluorinated copolymer (A).

3. The adhesive film according to claim 1, wherein the fluorinated resin layer has a thickness of from 3 to 15 μm.

4. The adhesive film according to claim 1, wherein the polyimide film has a thickness of from 3 to 50 μm.

5. The adhesive film according to claim 1, wherein the melt flow rate of the fluorinated copolymer (A) at 372° C. under a load of 49 N is from 0.5 to 15 g/10 min, and the melt flow rate of the fluorinated copolymer (A) subjected to heat treatment at 370° C. or higher is lower than the melt flow rate of the fluorinated copolymer (A) before the heat treatment.

6. The adhesive film according to claim 1, which has an entire thickness of at most 150 μm.

7. A flexible metal laminate comprising the adhesive film according to claim 1, and a metal film directly laminated on the fluorinated resin layer of the adhesive film.

8. A flexible printed circuit board, having a pattern circuit formed by etching the metal film of the flexible metal laminate according to claim 7.

9. A flexible printed circuit board, comprising a microstrip line comprising a microstrip transmission line formed by etching the metal foil of the flexible metal laminate according to claim 7, wherein
in the microstrip line, the transmission loss [a] after the following conditioning [a] and the transmission loss [b] after the following conditioning [b], measured at a temperature of from 20 to 25° C. under a humidity of from 40 to 60% RH after the conditioning [a] or [b], satisfy ([b]−[a])<0.004 dB/mm:

[a]: firing at a temperature of 105° C. for 48 hours;
[b]: firing at a temperature of 105° C. for 24 hours and storing at a temperature of 60° C. under a humidity of 90% RH for 24 hours.

10. A method for producing a flexible printed circuit board, which comprises:
forming a pattern circuit by etching the metal film of the flexible metal laminate according to claim 7; and
soldering on the pattern circuit with a soldering iron,
to form a flexible printed circuit board.

11. The adhesive film according to claim 1, wherein
the fluorinated resin layer has a thickness of from 3 to 15 μm,
the polyimide film has a thickness of from 5 to 25 μm.

12. The adhesive film according to claim 1, wherein the fluorinated resin layer has a thickness of from 6 to 15 μm, the polyimide film has a thickness of from 12.5 to 25 μm.

13. The flexible metal laminate according to claim 7, wherein the flexible metal laminate has a solder iron heat resistance of at least 330° C.

14. The flexible metal laminate according to claim 7, wherein the flexible metal laminate has a solder iron heat resistance of 330° C. to 340° C.

15. A method for producing an adhesive film, which comprises subjecting an adhesive film comprising
a fluorinated resin layer comprising a fluorinated copolymer (A) directly laminated on one side or both sides of a polyimide film, wherein the fluorinated copolymer (A) has a melting point of at least 280° C. and at most 320° C., is melt-moldable, and comprises structural units (a1) derived from tetrafluoroethylene, structural units (a2) derived from a cyclic hydrocarbon monomer having an acid anhydride residue and a polymerizable unsaturated bond and structural units (a3) derived from a fluorinated monomer, excluding tetrafluoroethylene, and the fluorinated resin layer has a thickness of from 1 to 20 μm,
to heat treatment at 370° C. or higher.

16. A method for producing a flexible metal laminate, which comprises subjecting a flexible metal laminate comprising an adhesive film and a metal film directly laminated on the fluorinated resin layer of the adhesive film, to heat treatment at 370° C. or higher,
wherein the adhesive film comprises a fluorinated resin layer comprising a fluorinated copolymer (A) directly laminated on one side or both sides of a polyimide film, wherein the fluorinated copolymer (A) has a melting point of at least 280° C. and at most 320° C., is melt-moldable, and comprises structural units (a1) derived from tetrafluoroethylene, structural units (a2) derived from a cyclic hydrocarbon monomer having an acid anhydride residue and a polymerizable unsaturated bond and structural units (a3) derived from a fluorinated monomer, excluding tetrafluoroethylene, and the fluorinated resin layer has a thickness of from 1 to 20 μm.

* * * * *